United States Patent
Trotta

(10) Patent No.: US 9,473,071 B2
(45) Date of Patent: Oct. 18, 2016

(54) SYSTEM AND METHOD FOR A RADIO FREQUENCY SYSTEM

(71) Applicant: Infineon Technologies AG, Neubiberg (DE)

(72) Inventor: Saverio Trotta, Munich (DE)

(73) Assignee: Infineon Technologies AG, Neubiberg (DE)

( * ) Notice: Subject to any disclaimer, the term of this patent is extended or adjusted under 35 U.S.C. 154(b) by 446 days.

(21) Appl. No.: 13/942,454

(22) Filed: Jul. 15, 2013

(65) Prior Publication Data

US 2015/0015431 A1    Jan. 15, 2015

(51) Int. Cl.
| | |
|---|---|
| G01S 13/02 | (2006.01) |
| H03B 27/00 | (2006.01) |
| G01S 7/03 | (2006.01) |
| G01S 13/32 | (2006.01) |
| G01S 13/93 | (2006.01) |

(52) U.S. Cl.
CPC .................. *H03B 27/00* (2013.01); *G01S 7/03* (2013.01); *G01S 13/0209* (2013.01); *G01S 13/32* (2013.01); *G01S 13/931* (2013.01)

(58) Field of Classification Search
CPC .. G01S 13/0209; G01S 13/32; G01S 13/931; G01S 7/03; H03B 27/00
USPC .................................................... 342/21, 175
See application file for complete search history.

(56) References Cited

U.S. PATENT DOCUMENTS

| | | | | |
|---|---|---|---|---|
| 4,724,437 A | * | 2/1988 | Jones | .................... G01S 13/586 |
| | | | | 342/101 |
| 7,002,511 B1 | * | 2/2006 | Ammar | .................... G01S 7/032 |
| | | | | 342/118 |
| 2006/0208833 A1 | * | 9/2006 | Sung | .................... H03H 3/02 |
| | | | | 333/189 |
| 2012/0146845 A1 | * | 6/2012 | Chen | .................... G01S 13/34 |
| | | | | 342/200 |

FOREIGN PATENT DOCUMENTS

WO    2010115418 A2    10/2010

OTHER PUBLICATIONS

Trotta, Saverio, et al., "An RCP Packaged Transceiver Chipset for Automotive LRR and SRR Systems in SiGe BiCMOS Technology," IEEE Transactions on Microwave Theory and Techniques, 2012, 17 pages.

* cited by examiner

*Primary Examiner* — Timothy A Brainard
(74) *Attorney, Agent, or Firm* — Slater Matsil, LLP

(57) ABSTRACT

In accordance with an embodiment, a method includes producing a baseband variable frequency signal and producing a substantially fixed frequency signal by phase-locking an oscillator to a substantially fixed reference frequency. The method further includes upconverting the baseband variable frequency signal by mixing the variable frequency signal with the substantially fixed frequency signal to produce an RF variable frequency signal.

15 Claims, 5 Drawing Sheets

SYSTEM AND METHOD FOR A RADIO FREQUENCY SYSTEM

TECHNICAL FIELD

The present disclosure relates generally to an electronic device, and more particularly to a system and method for a radio frequency (RF) transmission system.

BACKGROUND

Applications in the millimeter-wave frequency regime have gained significant interest in the past few years due to the rapid advancement in low cost semiconductor technologies such as silicon germanium (SiGe) and fine geometry complementary metal-oxide semiconductor (CMOS) processes. Availability of high speed bipolar and metal-oxide semiconductor (MOS) transistors has led to a growing demand for integrated circuits for mm-wave applications at 60 GHz, 77 GHz, and 80 GHz and also beyond 100 GHz. Such applications include, for example, automotive radar and multi-gigabit communication systems.

In some radar systems, the distance between the radar and a target is determined by transmitting a frequency modulated signal, receiving a reflection of the frequency modulated signal, and determining a distance based on a time delay and/or frequency difference between the transmission and reception of the frequency modulated signal. Resolution, accuracy and sensitivity of the radar system may depend, in part, on the phase noise performance and frequency agility of the radar's frequency generation circuitry, which generally includes an RF oscillator and circuitry that controls the frequency of the RF oscillator.

As the operating frequencies of RF systems continue to increase, however, the generation of signals at such high frequencies poses a major challenge. Oscillators that operate at high frequencies may suffer from a poor phase noise performance and a low output power in some systems. Maintaining a low phase noise and high frequency agility in radar systems is particularly difficult as design techniques used to increase frequency agility may compromise phase noise performance and design techniques used to reduce phase noise may compromise frequency agility.

SUMMARY OF THE INVENTION

In accordance with an embodiment, a method includes producing a baseband variable frequency signal and producing a substantially fixed frequency signal by phase-locking an oscillator to a substantially fixed reference frequency. The method further includes upconverting the baseband variable frequency signal by mixing the variable frequency signal with the substantially fixed frequency signal to produce an RF variable frequency signal.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for a radar system, such as an automotive radar system. The invention may also be applied to other systems and applications that use RF oscillators, such as general radar systems and wireless communications systems.

Figure 1A:
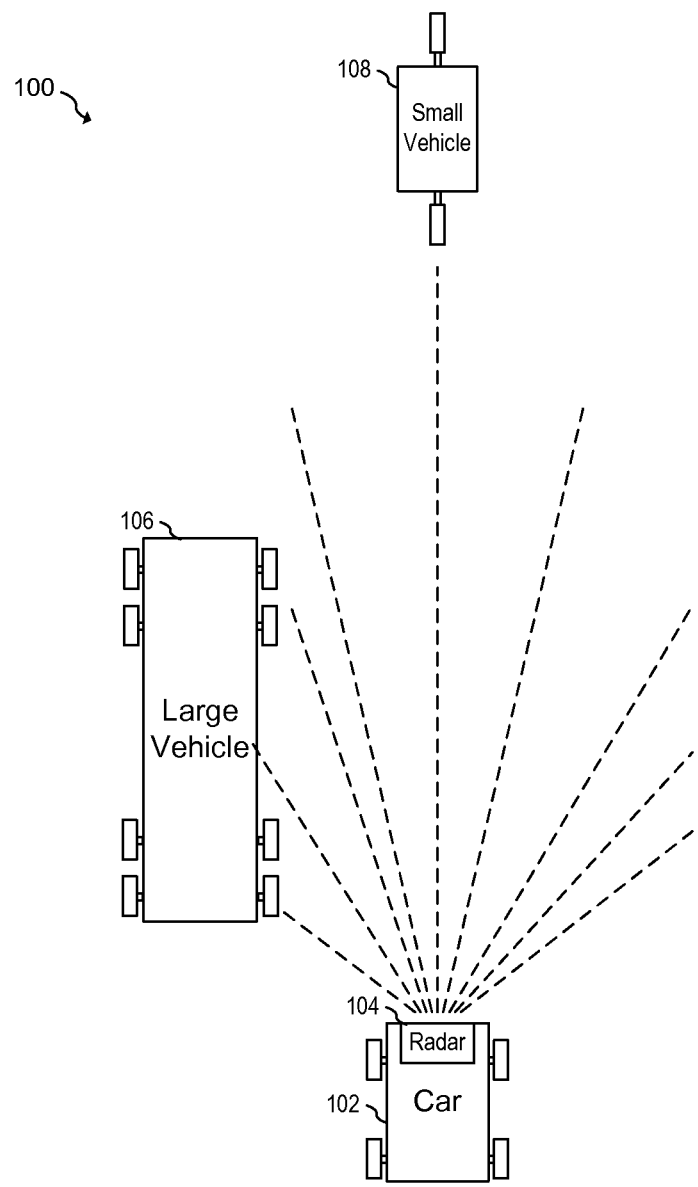
FIGS. 1a-b illustrate the operation of an example automotive radar system.

FIG. 1a illustrates an example automotive radar scenario 100 in which automobile 102 has automotive radar system 104. Automotive radar system 104 transmits and receives, for example, a frequency modulated continuous wave (FMCW) signal, and detects reflections of this transmitted signal in order to determine a distance between automotive radar 104 and other vehicles or objects on the road. In the illustrated scenario, a large vehicle 106, such as a truck is closer to automobile 102 then a small vehicle 108, such as a motorcycle. Under normal operating conditions, the echo or reflection off large vehicle 106 will be of a higher amplitude then the reflection off small vehicle 108 because large vehicle 106 is both larger and closer than small vehicle 108.

Figure 1B:
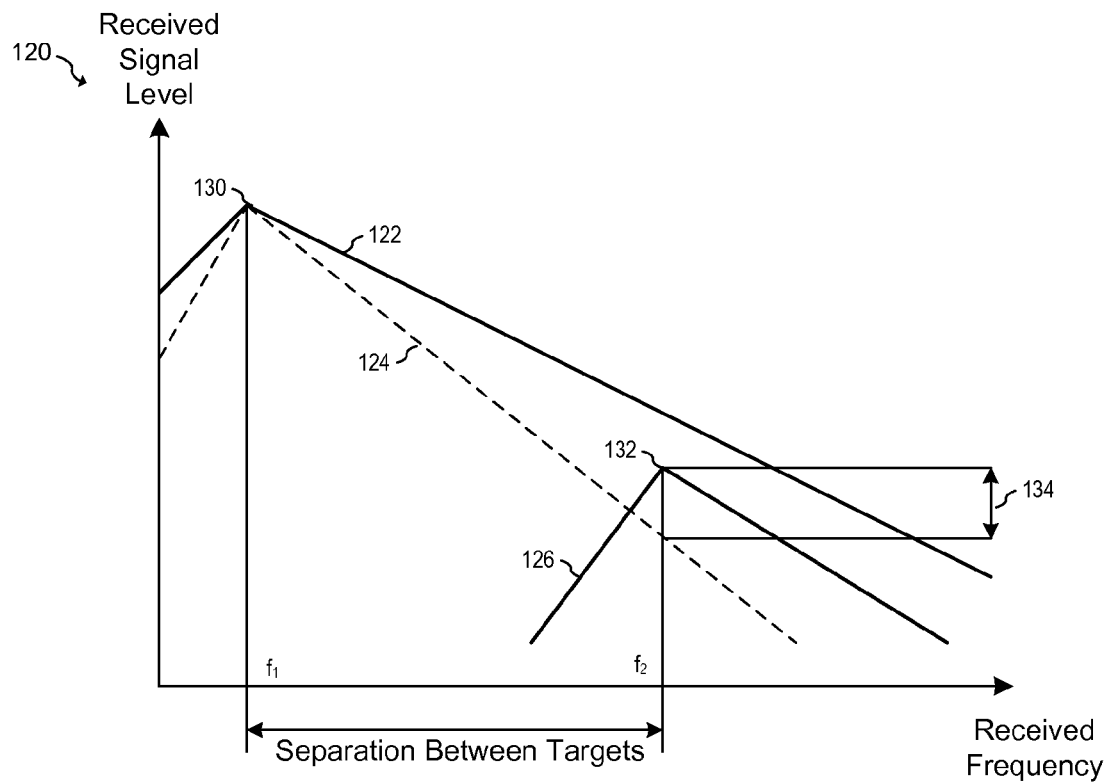

FIG. 1b illustrates a graph 120 of received signal level versus received frequency for the scenario of FIG. 1a. Signal level versus frequency curve 122 corresponds to the received reflection from large vehicle 106 and the frequency f1 of signal level peak 130 corresponds to the distance between radar 104 and large vehicle 106. Likewise, signal level versus frequency curve 126 corresponds to the received reflection from small vehicle 108 and the frequency F2 of the signal level peak 132 corresponds to the distance between radar 104 and small vehicle 108. Accordingly, the distance between large vehicle 106 and small vehicle 108 is proportional to the separation between frequencies F1 and F2.

Along with the desired output signal, the phase noise of the radar transmitter is also transmitted and reflected. The phase noise reflected from large vehicle 106 is represented as dashed line 124. As seen in graph 120, phase noise 124 affects the ability of the radar to receive signals reflected from small vehicle 108. The signal to noise ratio between signal level peak 132 due to small vehicle 108 and the corresponding noise floor due to phase noise reflected from large vehicle 106 is represented as length 134. It can be seen from the graph of FIG. 1B, that phase noise affects the ability of radar 104 two discern small and distant objects.

The higher the phase noise of the radar transmitter, the less able the radar system is able to discern small and distant objects.

Figure 2A:
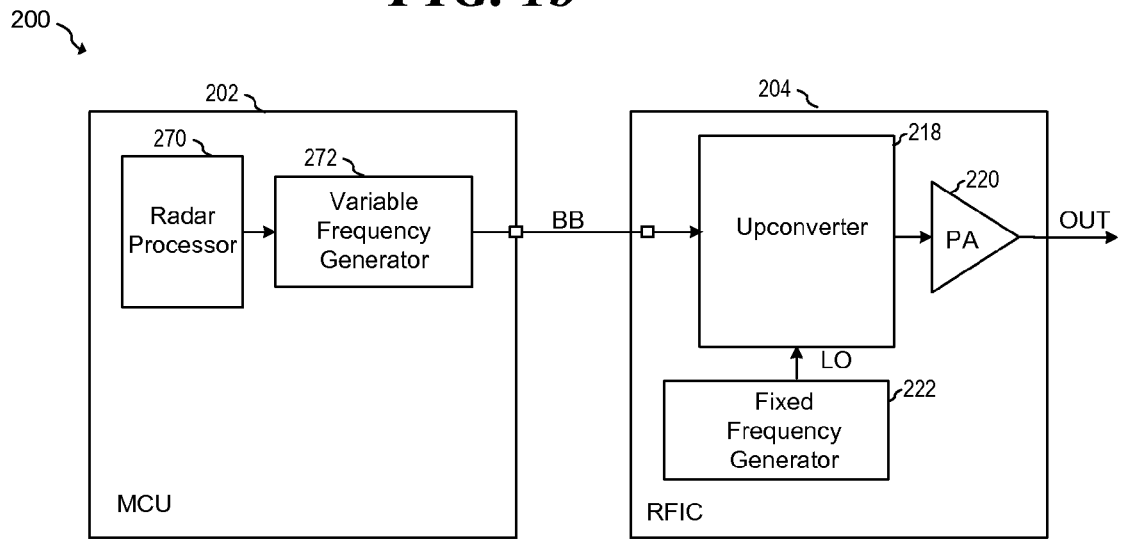
FIGS. 2a-c illustrate embodiment radio frequency transmission systems.

FIG. 2a illustrates an embodiment radar transmission system 200 that includes microcontroller unit (MCU) 202 and RF integrated circuit (RFIC) 204. In an embodiment, MCU 202 includes radar processor 270 and variable frequency generator 272, and RFIC 204 includes upconverter 218, fixed frequency generator 222 and power amplifier 220. An RF variable frequency signal is generated at node OUT as a result of producing a baseband variable frequency signal BB using variable frequency generator 272 controlled by radar processor 270. Upconverter 218 mixes the baseband variable frequency signal BB to a high frequency, the output of which is amplified by power amplifier 220. In some embodiments, the output frequency of upconverter 218 is greater than 10 GHz or 24 GHz. In some cases, the output frequency may be at about 60 GHz, 77 GHz, and 80 GHz and frequencies above 100 GHz. Alternatively, other output frequencies may be used. Fixed frequency generator 222 provides the local oscillator signal LO to upconverter 218. In an embodiment, fixed frequency generator uses an RF oscillator whose frequency is controlled by a low-bandwidth phase locked loop, the bandwidth of which may be between about 1 KHz and about 10 KHz, although other bandwidths are possible in alternative embodiments. Radar processor 270 may control variable frequency generator 272 such a frequency modulated continuous wave (FMCW) signal or a frequency shift keying (FSK) signal is produced. In some embodiments, the FMCW signal may be a fast ramp modulation that may be used to detect multiple target scenarios and generate a three-dimensional output at reception. Alternatively, other modulation schemes may be used such as quadrature amplitude modulation (QAM), quadrature phase-shift keying (QPSK) and orthogonal frequency division Multiplexing (OFDM). Besides controlling the output frequency of variable frequency generator 272, radar processor may also determine a distance to a target or a relative speed between the radar and the target based on a reflected signal received by a receiver (not shown).

By using a fixed frequency generator 222 and variable frequency generator 272, the phase noise of output signal OUT at offsets exceeding the loop bandwidth of fixed frequency generator 222 may be kept low. Moreover, high frequency agility is made possible by changing the output frequency of upconverter 218 via variable frequency generator 272. In some embodiments, power amplifier 220 is used to amplify the output of upconverter 204. Power amplifier 220 that is coupled to the output of quadrature up converter 218 may be implemented using circuit design techniques known in the art.

Figure 2B:
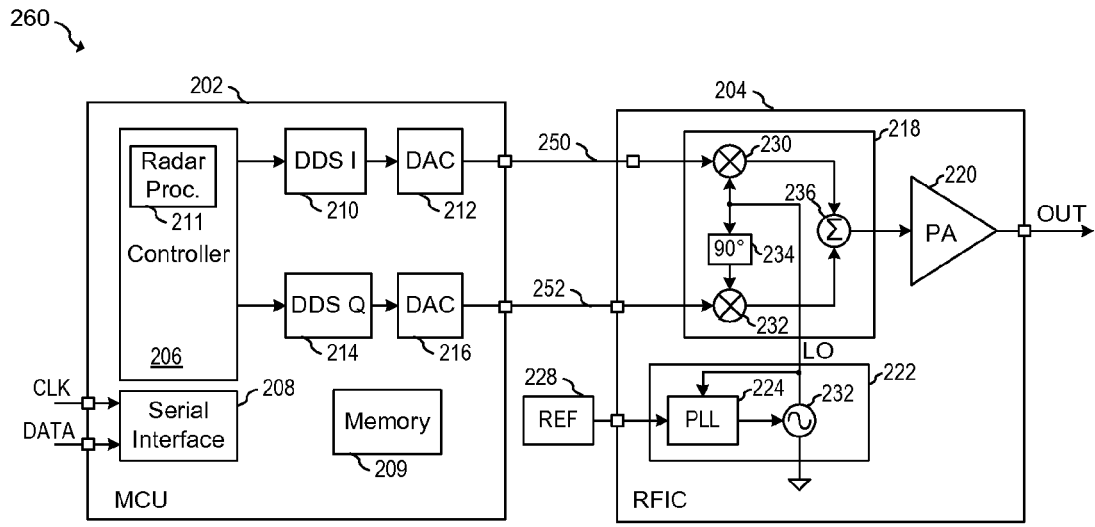

FIG. 2b illustrates a more detailed implementation example 260 of an embodiment radar transmission system that includes microcontroller unit (MCU) 202 and RF integrated circuit (RFIC) 204. MCU 202 includes controller 206, serial interface 208, memory 209, and a quadrature frequency generation circuit that includes in-phase direct digital synthesizer (DDS) 210 and quadrature DDS 214. Digital to analog converters (DACs) 212 and 216 convert the output of DDS 210 and 214 to the analog domain to produce in-phase and quadrature signals 250 and 252. In an embodiment, the outputs of DDS 210 and DDS 214 produce a digital frequency modulated continuous wave (FMCW) signal.

DDS 210 and 214 may be implemented using techniques known in the art. In one embodiment, the DDS 210 and 214 to each produce a 12-bit signal representing a sinusoidal frequency sweep that goes from 50 MHz to 250 MHz in between about 10 µs and about 50 µs. It should be appreciated that in alternative embodiments, other bit widths different from 12 bits, and/or frequency sweep ranges different from 50 MHz to 250 MHz may be used. Alternatively, other frequency ranges and sweep times may be used. DACs 212 and 216 may also be implemented using techniques known in the art. In some embodiments, MCU 202 further includes serial interface 208 coupled to input pins CLK and DATA. The serial interface may be implemented, for example, using a serial peripheral interface (SPI), an inter-integrated circuit ($I^2C$) interface, mobile industry processor interface/RF front-end (MIPI/RFFE) or other serial interface known in the art. In alternative embodiments of the present invention, interface 208 may also be implemented using a parallel interface.

RFIC 204 includes upconverter 218, power amplifier 220 and frequency generation circuit 222. In an embodiment, upconverter 218 may be implemented using quadrature upconverter architecture as shown. In the illustrated embodiment, upconverter 218 includes in-phase mixer 230, a quadrature mixer 232 and a summation circuit 236 that adds the output of in phase mixer 230 and quadrature mixer 232. Phase shift block 234 provides a 90° phase shift of local oscillator signal LO. Mixers 230 and 232 may be implemented, for example, by using a Gilbert mixer or other mixer architecture, and phase shift block 234 may be in implemented using a polyphase filter or other phase shift circuit.

In an embodiment, frequency generation circuit 222 includes RF oscillator 226 that is controlled by phase locked loop circuit 224. In embodiments, the loop bandwidth of frequency generation circuit 222 is between about 1 kHz or about 10 kHz. By having a low loop bandwidth, phase noise above the loop bandwidth approaches the phase noise floor of RF oscillator 226 itself, thereby allowing for a lower noise floor at larger frequency offsets. Reference block 228 generates a low frequency clock signal between about 40 MHz and about 80 MHz to which RF oscillator 226 is phase locked using a phase locked loop circuitry 224. Reference block 228 may be implemented, for example, using a crystal oscillator circuit. In some embodiments, the phase-locked loop (PLL) bandwidth is made large enough to follow pushing and pulling of the RF oscillator and the temperature of RF oscillator 226. Because the RF oscillator 226 operates at a substantially fixed frequency, a large tuning range is not necessary because the RF oscillator is used as a carrier. However, the tuning range of RF oscillator 226 may be made large enough to cover process variations in temperature drift. RF oscillator 226 may be implemented using oscillator circuits known in the art, for example, an LC tank oscillator such as a Colpitts oscillator. Because RF oscillator 226 is operated at a substantially fixed frequency, a high Q tank may be used, thereby allowing for lower phase noise. In an embodiment, RF oscillator 206 may operate at millimeter wave frequencies such as 60 GHz, 77 GHz, and 80 GHz and frequencies above 100 GHz. It should be appreciated, however, that operation frequencies may be used in alternative embodiments.

Because the FMCW signal is generated using DDS blocks 210 and 214, the loop bandwidth of frequency generation circuit 222 may be relatively low. In an embodiment, RFIC 204 may be implemented, for example, on a high frequency process such as a SiGe Bipolar or BiCMOS process, an RF CMOS process or other high frequency process. On the other hand, MCU integrated circuit 202 may be implemented in a fine geometry CMOS process. For example, in some embodiments, a 40 nm CMOS process is used with a 1.5 V power supply.

In other embodiments, RFIC 204 also includes peak detectors (not shown) for use in a feedback loop for RF oscillator 226, and MCU 202 includes various calibration blocks that may be used to adjust the phase of DDS 210 and 214. By adjusting the phase of DDS 210 and 214, sideband suppression of the signal output by RFIC 204 is enhanced and/or is optimized.

Figure 2C:
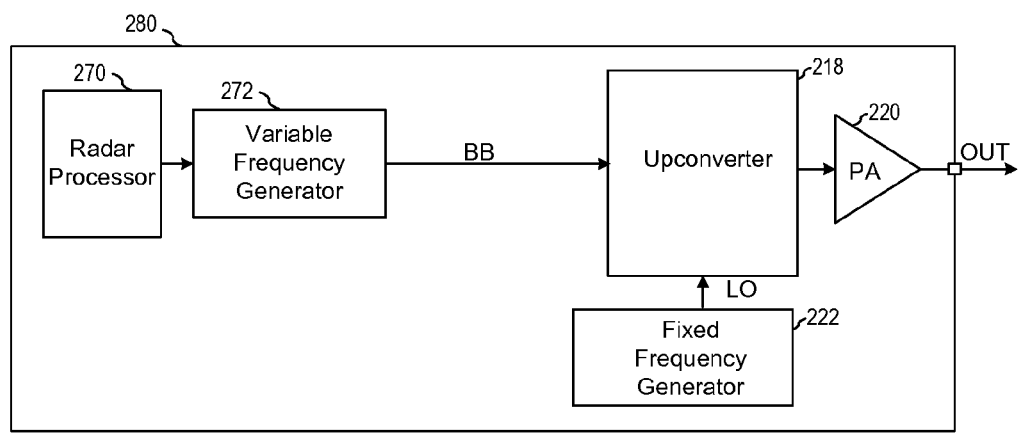

FIG. 2c illustrates single-chip radar transmission system 280 that includes radar processor 270 and variable frequency generator 272, upconverter 218, fixed frequency generator 222 and power amplifier 220. An RF variable frequency signal is generated at node OUT as a result of producing a baseband variable frequency signal BB using variable frequency generator 272 controlled by radar processor 270. In some embodiments, the RF variable frequency signal is generated at node OUT is greater than about 24 GHz.

Figure 3A:
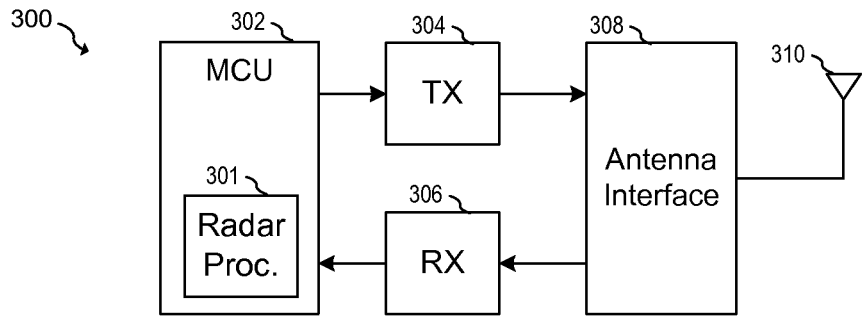
FIGS. 3a-c illustrate embodiment radar systems.
Figure 3B:
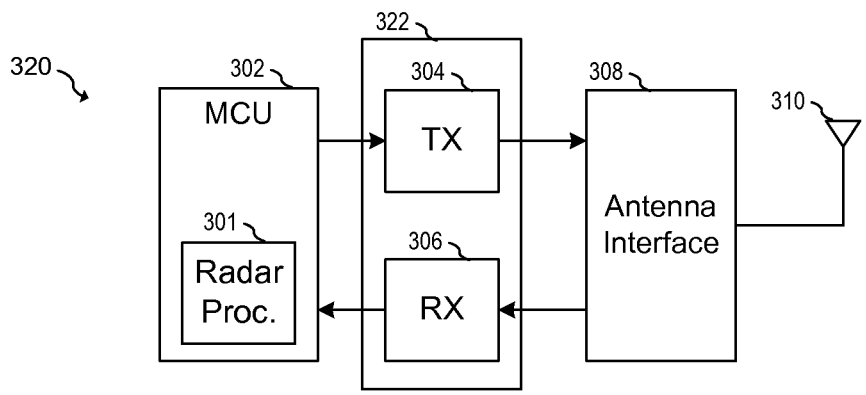
Figure 3C:
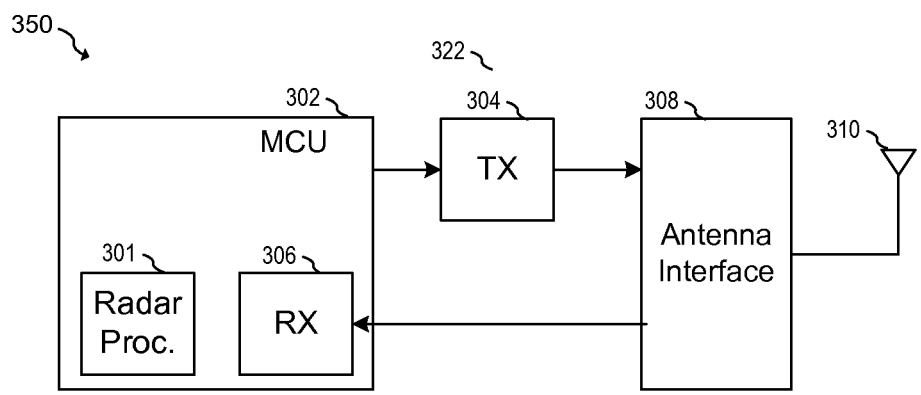

FIGS. 3a-c illustrates various embodiment radar systems. FIG. 3a illustrates radar system 300 that includes MCU 302 having radar processor 301 and RF transmitter circuit 304. In some embodiments, MCU 302 and RF transmitter 304 may be implemented in a similar manner as MCU 202 and RFIC 204 as described with respect to the embodiment of FIGS. 2a-b. Radar processor 301 may be implemented, for example, using a processor, software running on a processor, or custom logic. Furthermore, radar system 300 also includes receive circuit 306, antenna interface 308 and antenna 310. In some embodiments, antenna 310 may be a radar antenna implemented according to circuit techniques and methods known in the art. Antenna interface 308 may include, for example, antenna matching networks. In some embodiments, antenna interface 308 includes adjustable or programmable matching networks that can be calibrated at manufacture, and/or controlled by MCU 302. Receive block 306 may also be implemented using techniques known in the art. In the illustrated embodiment of FIG. 3a, MCU 304, transmitter circuit 304 and receiver 306 may be implemented on separate integrated circuits having separate substrates. Alternatively, transmitter circuit and receive circuit 306 may be disposed on a same integrated circuit 322 as shown in FIG. 3b, or on the same integrated circuit as MCU 302 as shown in FIG. 3c. It should be appreciated that the embodiments of FIGS. 3a-c are only three specific examples of may possible embodiment radar systems.

Figure 4:
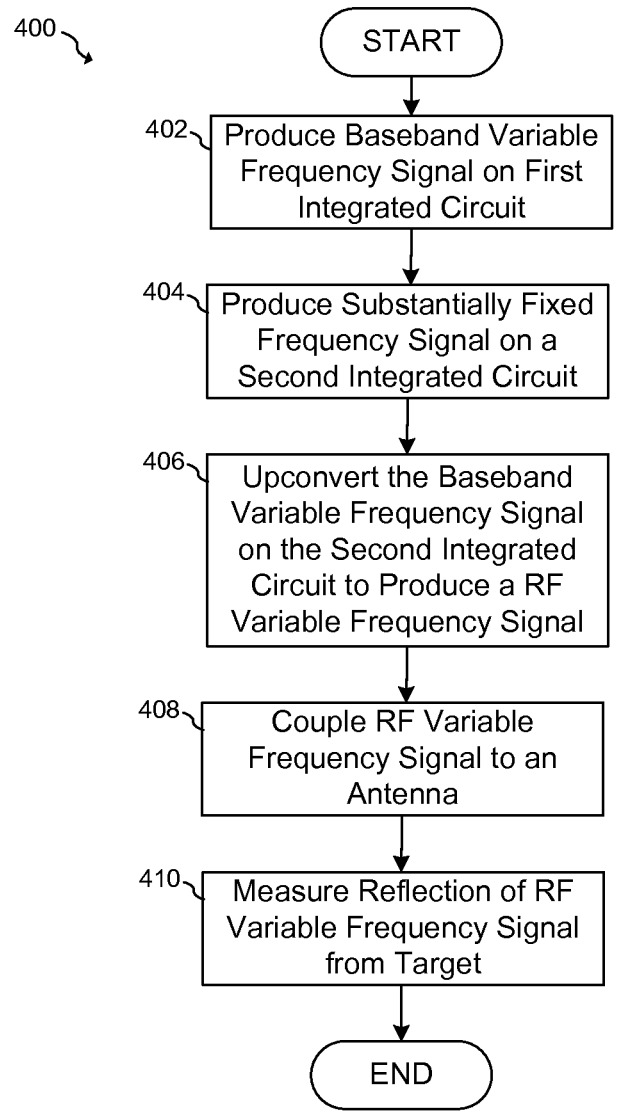
FIG. 4 illustrates a block diagram of an embodiment method.

FIG. 4 illustrates a block diagram 400 of an embodiment method. In step 402, a baseband variable frequency signal is produced on the first integrated circuit. This variable frequency baseband signal may be produced, for example, using a DDS or other digital signal generation technique. In some embodiments, the output of the DDS is converted into the analog domain using an analog-to-digital converter. The DDS may produce an in phase and a quadrature signal by using, for example, two DDS circuits. Alternatively, the baseband variable frequency signal may be produced using analog signal processing techniques. In radar systems, baseband variable frequency signal may be a FMCW signal such as a chirp signal, or other variable frequency signal such as frequency shift keying (FSK). In embodiments, the first integrated circuit that produces the baseband variable frequency signal may be implemented, for example, on fine geometry CMOS process, such as a 40 nm process.

Next, in step 404, a substantially fixed frequency signal is generated on a second integrated circuit. In some embodiments, the substantially fixed frequency signal may be generated using a low bandwidth phase locked loop that is locked on a reference signal. The voltage controlled oscillator (VCO) within the phase locked loop may be implemented using a low phase noise architecture such as a Colpitts oscillator, for example. In step 406, the baseband variable frequency signal is up converted on the second integrated circuit to produce an RF variable frequency signal. In some embodiments, the up conversion of step 406 is a quadrature up conversion. By using a quadrature up conversion along with an in phase and quadrature baseband variable frequency signal, a single sideband output signal may be generated. Next, in step 408, the RF variable frequency signal is coupled to an antenna and a reflection of the RF variable signal is measured in step 410.

In some embodiments, the second integrated circuit may be implemented using, for example, a high frequency process suitable for RF circuits, for example, SiGe bipolar, SiGe CMOS, or other high speed process.

In accordance with an embodiment, a method of operating a radio frequency (RF) system includes producing a baseband variable frequency signal, and producing a substantially fixed frequency signal by phase-locking an oscillator to a substantially fixed reference frequency. The method further includes upconverting the baseband variable frequency signal by mixing the variable frequency signal with the substantially fixed frequency signal to produce an RF variable frequency signal, transmitting the RF variable frequency signal toward a target, and determining at least one of a distance and velocity of the target based on receiving a reflected RF variable frequency signal. In an embodiment, the step of producing the baseband variable frequency signal is performed on a first integrated circuit, and the steps of producing the substantially fixed frequency signal and upconverting the baseband variable frequency signal are performed on a second integrated circuit having a separate substrate from the first integrated circuit.

Producing the variable frequency signal may include generating a digital variable frequency signal, and converting the digital variable frequency signal to an analog domain to produce the baseband variable frequency signal. Generating the digital variable frequency signal may include using a direct digital synthesizer (DDS) and/or generating a swept sinewave.

In an embodiment, the method may further include coupling the RF variable frequency signal on an antenna, and measuring a reflection of the RF variable frequency signal from a target. In some embodiments, producing the baseband variable frequency signal includes producing an in-phase baseband variable frequency signal and a quadrature baseband variable frequency signal, and producing the substantially fixed frequency signal further comprises producing an in-phase substantially fixed frequency signal and a quadrature substantially fixed frequency signal. Upconverting the baseband variable frequency signal may include mixing the in-phase baseband variable frequency signal with the in-phase substantially fixed frequency signal to produce an upconverted in-phase signal, mixing the quadrature baseband variable frequency signal with the quadrature substantially fixed frequency signal to produce an upconverted quadrature signal, and summing the upconverted in-phase signal with the upconverted quadrature signal to produce the RF variable frequency signal.

In accordance with a further embodiment, a radio frequency (RF) system includes a digital signal generator configured to provide a digital variable frequency signal, a digital-to-analog converter (DAC) having an input coupled to an output of the digital signal generator, a radar control circuit configured to control the digital signal generator and to analyze reflected signals, an upconverter having an input coupled to an output of the DAC, and a frequency generation circuit that includes an oscillator having an output coupled to the upconverter and a phase-locked loop circuit coupled to the oscillator. The phase-locked loop circuit is configured to phase lock the oscillator to a substantially fixed frequency, the upconverter is configured to convert the analog baseband variable frequency signal to an RF variable frequency signal having a frequency greater than 24 GHz, and the DAC is configured to provide an analog baseband variable frequency signal. The digital signal generator may be implemented using a direct digital synthesizer (DDS).

In an embodiment, upconverter includes a quadrature upconverter, and the digital signal generator is configured to provide an in-phase digital variable frequency signal and a quadrature digital variable frequency signal.

In an embodiment, the RF system further includes an RF power amplifier having an input coupled to an output of the upconverter, and may also include an antenna coupled to an output of the RF power amplifier. The RF system may also include a controller coupled to the digital signal generator, which may be configured to cause the digital signal generator to produce a swept frequency signal.

In an embodiment, the digital signal generator, the DAC, the radar control unit, the upconverter and frequency generation circuit are disposed on a single semiconductor substrate. In a further embodiment, the digital signal generator, the DAC and the radar control unit are disposed on a first integrated circuit, while the upconverter and the frequency generation circuit are disposed on a second integrated circuit such that the first integrated circuit is disposed on a separate semiconductor substrate from the second integrated circuit. The first integrated circuit may be implemented on a digital CMOS integrated circuit and the second integrated circuit may be implemented on an RF integrated circuit.

In accordance with a further embodiment, a radar system includes a first integrated circuit having a quadrature variable frequency digital signal generator, and a digital-to-analog converter (DAC) coupled to a quadrature variable frequency digital signal generator. The radar system further includes a second integrated circuit having a quadrature upconverter coupled to an output of the DAC, a radar control circuit configured to control the digital signal generator and to analyze reflected signals, and a PLL circuit configured to generate a substantially fixed frequency signal to an output of the quadrature upconverter. The first integrated circuit is disposed on a separate semiconductor substrate from the second integrated circuit.

In an embodiment, the PLL circuit has a loop bandwidth of less than 10 KHz and/or the quadrature variable frequency digital signal generator comprises a direct digital synthesizer (DDS). The radar system may also include a controller configured to cause the quadrature variable frequency digital signal generator to produce swept sinewave having a frequency that varies over time. In an embodiment, the second integrated circuit further includes an RF power amplifier coupled to an output of the quadrature upconverter. An antenna coupled to an output of the quadrature upconverter.

Advantages of embodiments of the present invention include ability to detect multiple simultaneous radar targets because of high phase noise performance of some embodiment systems. A further advantage of embodiment systems includes the ability to provide agile frequency modulation having a high phase noise performance.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description.

What is claimed is:

1. A radio frequency (RF) system comprising:
   a digital signal generator configured to provide a digital variable frequency signal;
   a digital-to-analog converter (DAC) having an input coupled to an output of the digital signal generator, wherein the DAC is configured to provide an analog baseband variable frequency signal;
   a radar control circuit configured to control the digital signal generator and to analyze reflected signals;
   an upconverter having an input coupled to an output of the DAC, wherein the upconverter is configured to convert the analog baseband variable frequency signal to an RF variable frequency signal; and
   a frequency generation circuit comprising an oscillator having an output coupled to the upconverter, and a phase-locked loop circuit coupled to the oscillator, wherein the phase-locked loop circuit is configured to phase lock the oscillator to a substantially fixed frequency, the digital signal generator, the DAC and the radar control circuit are disposed on a first integrated circuit, and the upconverter and the frequency generation circuit are disposed on a second integrated circuit, wherein the first integrated circuit is disposed on a separate semiconductor substrate from the second integrated circuit.

2. The RF system of claim 1, wherein the RF variable frequency signal has a frequency greater than 24 GHz.

3. The RF system of claim 1, wherein the digital signal generator comprises a direct digital synthesizer (DDS).

4. The RF system of claim 1, wherein:
   the upconverter comprises a quadrature upconverter; and
   the digital signal generator is configured to provide an in-phase digital variable frequency signal and a quadrature digital variable frequency signal.

5. The RF system of claim 1, further comprising an RF power amplifier having an input coupled to an output of the upconverter.

6. The RF system of claim 5, further comprising an antenna coupled to an output of the RF power amplifier.

7. The RF system of claim 1, further comprising a controller coupled to the digital signal generator.

8. The RF system of claim 7, wherein the controller is configured to cause the digital signal generator to produce a swept frequency signal.

9. The RF system of claim 1, wherein the first integrated circuit comprises a digital CMOS integrated circuit and the second integrated circuit comprises an RF integrated circuit.

10. A radar system comprising:
   a first integrated circuit comprising
      a quadrature variable frequency digital signal generator, and
      a digital-to-analog converter (DAC) coupled to a quadrature variable frequency digital signal generator; and
   a second integrated circuit comprising
      a quadrature upconverter coupled to an output of the DAC,
      a radar control circuit configured to control the digital signal generator and to analyze reflected signals, and
      a phase-locked loop (PLL) circuit configured to provide a substantially fixed frequency signal to an output of the quadrature upconverter, wherein the first integrated circuit is disposed on a separate semiconductor substrate from the second integrated circuit.

11. The radar system of claim 10, wherein the PLL circuit has a loop bandwidth of less than 10 KHz.

12. The radar system of claim 10, wherein the quadrature variable frequency digital signal generator comprises a direct digital synthesizer (DDS).

13. The radar system of claim 12, further comprising a controller configured to cause the quadrature variable frequency digital signal generator to produce swept sinewave having a frequency that varies over time.

14. The radar system of claim 10, wherein the second integrated circuit further comprises an RF power amplifier coupled to an output of the quadrature upconverter.

15. The radar system of claim 10, further comprising an antenna coupled to an output of the quadrature upconverter.

* * * * *